(12) United States Patent
Li et al.

(10) Patent No.: US 12,514,076 B2
(45) Date of Patent: Dec. 30, 2025

(54) DISPLAY SUBSTRATE AND DISPLAY APPARATUS

(71) Applicant: BOE Technology Group Co., Ltd., Beijing (CN)

(72) Inventors: Zhao Li, Beijing (CN); Shiming Shi, Beijing (CN); Liming Dong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 660 days.

(21) Appl. No.: 17/909,996

(22) PCT Filed: Nov. 16, 2021

(86) PCT No.: PCT/CN2021/130806
§ 371 (c)(1),
(2) Date: Sep. 8, 2022

(87) PCT Pub. No.: WO2022/193699
PCT Pub. Date: Sep. 22, 2022

(65) Prior Publication Data
US 2024/0206252 A1 Jun. 20, 2024

(30) Foreign Application Priority Data
Mar. 17, 2021 (CN) .......................... 202110285987.6

(51) Int. Cl.
*H10K 59/131* (2023.01)
*H10K 59/90* (2023.01)
*H10K 102/00* (2023.01)

(52) U.S. Cl.
CPC ........... *H10K 59/131* (2023.02); *H10K 59/90* (2023.02); *H10K 2102/311* (2023.02)

(58) Field of Classification Search
CPC .................................................. H10K 59/131
See application file for complete search history.

(56) References Cited

U.S. PATENT DOCUMENTS

2014/0217382 A1* 8/2014 Kwon ................ H10K 50/8426
257/40
2017/0338294 A1 11/2017 Choi et al.
(Continued)

FOREIGN PATENT DOCUMENTS

CN 205303466 U 6/2016
CN 107425036 A 12/2017
(Continued)

OTHER PUBLICATIONS

International Search Report for PCT/CN2021/130806 Mailed Feb. 16, 2022.
(Continued)

*Primary Examiner* — Douglas M Menz
(74) *Attorney, Agent, or Firm* — Ling Wu; Stephen Yang; Ling and Yang Intellectual Property

(57) ABSTRACT

A display substrate and a display apparatus, the display substrate includes a display region and a bonding region located on a side of the display region, the bonding region includes a first bending area close to the display region, and a transition connection area, a second bending area and a bonding pin area connected sequentially along a direction away from the first bending area, the transition connection area connects the first bending area with the second bending area; the transition connection area, the second bending area and the bonding pin area are bent to a side of the display region facing away from a display side through the first bending area; the bonding pin area is bent toward a surface of the display region facing away from the display side through the second bending area, and the bonding pin area is in bonding connection with an external circuit board.

11 Claims, 6 Drawing Sheets

(56) References Cited

U.S. PATENT DOCUMENTS

2019/0326529 A1* 10/2019 Xie ..................... B29C 53/063
2020/0096806 A1 3/2020 Reeves
2020/0372850 A1 11/2020 He et al.
2021/0064083 A1 3/2021 Song
2021/0064088 A1 3/2021 Kim et al.
2021/0408501 A1 12/2021 Yu et al.

FOREIGN PATENT DOCUMENTS

| | | |
|---|---|---|
| CN | 107484328 A | 12/2017 |
| CN | 109240013 A | 1/2019 |
| CN | 109952555 A | 6/2019 |
| CN | 110391279 A | 10/2019 |
| CN | 111007674 A | 4/2020 |
| CN | 111740030 A | 10/2020 |
| CN | 111864115 A | 10/2020 |
| CN | 112287804 A | 1/2021 |
| CN | 112366220 A | 2/2021 |
| CN | 112447104 A | 3/2021 |
| CN | 113066832 A | 7/2021 |

OTHER PUBLICATIONS

Office Action dated Feb. 22, 2022 for Chinese Patent Application No. 202110285987.6 and English Translation.
Office Action dated Jul. 26, 2022 for Chinese Patent Application No. 202110285987.6 and English Translation.
Decision to Grant dated Oct. 12, 2022 for Chinese Patent Application No. 202110285987.6 and English Translation.

* cited by examiner

DISPLAY SUBSTRATE AND DISPLAY APPARATUS

CROSS-REFERENCE TO RELATED APPLICATIONS

The present application is a U.S. National Phase Entry of International Application PCT/CN2021/130806 having an international filing date of Nov. 16, 2021, which claims priority of Chinese Patent Application No. 202110285987.6, filed to the CNIPA on Mar. 17, 2021 and entitled "Display Substrate and Display Apparatus", and the contents disclosed in the above-mentioned application are hereby incorporated as a part of this application.

TECHNICAL FIELD

Embodiments of the present disclosure relate to, but are not limited to, the field of display technologies, and more particularly to a display substrate and a display apparatus.

BACKGROUND

At present, a narrow bezel design is achieved by development of conducting Pad bending of a bonding side of a flexible display substrate. In order to enhance competitiveness of a flexible display product, space occupied by a flexible display module is required quite high in the design of the whole flexible display product. Therefore, it is necessary to reduce a volume of the flexible display module and save space for the whole flexible display product.

SUMMARY

The following is a summary of subject matter described herein in detail. The summary is not intended to limit the protection scope of claims.

An embodiment of the present disclosure provides a display substrate, including a display region and a bonding region located on a side of the display region, wherein the bonding region includes a first bending area close to the display region, and a transition connection area, a second bending area and a bonding pin area which are connected sequentially along a direction away from the first bending area, the transition connection area connects the first bending area with the second bending area; the transition connection area, the second bending area and the bonding pin area are bent to a side of the display region facing away from the display side through the first bending area; and the bonding pin area is bent toward a surface of the display region facing away from the display side through the second bending area, and the bonding pin area is disposed to be in bonding connection with an external circuit board.

An embodiment of the present disclosure further provides a display device including the display substrate described above.

Other aspects may be understood upon reading and understanding of the drawings and the detailed description.

BRIEF DESCRIPTION OF DRAWINGS

The drawings provide an understanding for the embodiments of the present disclosure, form a part of the specification, and are used to explain the technical solutions of the present disclosure together with the embodiments of the present disclosure and are not intended to form limitations on the technical solutions of the present disclosure. Shapes and sizes of various components in the drawings do not reflect actual scales, and are only intended to schematically illustrate the contents of the present disclosure.

DETAILED DESCRIPTION

Those of ordinary skills in the art should understand that modifications or equivalent replacements may be made to the technical solutions of the embodiments of the present disclosure without departing from the spirit and scope of the technical solutions of the embodiments of the present disclosure, and should all fall within the scope of the claims of the present disclosure.

An embodiment of the present disclosure provides a display substrate, including a display region and a bonding region located on a side of the display region. The bonding region includes a first bending area close to the display region, and a transition connection area, a second bending area and a bonding pin area which are connected sequentially along a direction away from the first bending area, and the transition connection area connects the first bending area with the second bending area. The transition connection area, the second bending area and the bonding pin area are bent to a side of the display region facing away from a display side through the first bending area. The bonding pin area is bent toward a surface of the display region facing away from the display side through the second bending area, and the bonding pin area is configured to be in bonding connection with an external circuit board.

In the display substrate of the embodiment of the present disclosure, the bonding region may be bent twice by disposing the first bending area and the second bending area, and the bonding pin area is bent toward the surface (back surface of the display region) of the display region which is facing away from the display side by disposing the second bending area. Therefore, compared with some display substrates without the second bending area, space on a side of the bonding region facing away from the display region can be saved, and when the display substrate of the embodiment of the present disclosure is applied to a flexible display module, a thickness of the flexible display module in a direction perpendicular to the display region can be reduced, a volume of the flexible display module can be reduced, and space occupied by the flexible display module can be saved, which is beneficial to an optimal design of a whole machine space.

Figure 1:
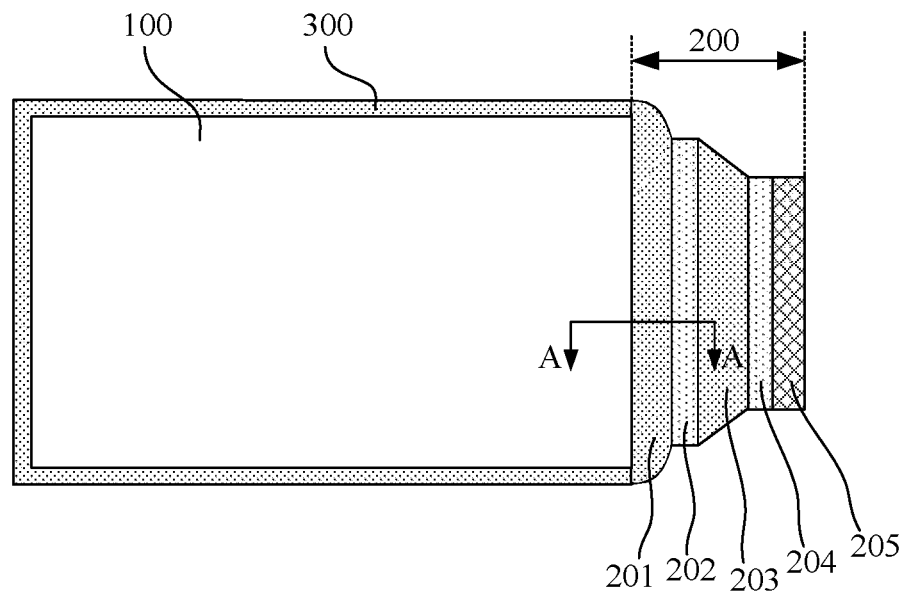
FIG. 1 is a schematic diagram of a planar structure of a display substrate according to some exemplary embodiments.

In some exemplary embodiments, as shown in FIG. 1, FIG. 1 is a schematic diagram of a planar structure of a display substrate according to some exemplary embodiments. The display substrate of the embodiment of the present disclosure includes a display region 100 and a non-display region located at a periphery of the display region 100, wherein the non-display region includes a bonding region 200 located at a side of the display region 100 and an edge region 300 located at other sides of the display region 100. The display region 100 includes multiple display units arranged regularly and is configured to display images. The bonding region 200 includes a bonding circuit for connecting signal lines of the multiple display units to an external drive apparatus. The edge region 300 includes power supply lines for transmitting voltage signals to the multiple display units of the display region 100. The bonding region 200 includes a wiring leading-out area 201, a first bending area 202, a transition connection area 203, a second bending area 204, and a bonding pin area 205 that are sequentially disposed in a direction away from the display region 100. The wiring leading-out area 201 includes multiple data leads, a first power supply line, and a second power supply line. The multiple data leads are configured to be connected with data lines of the display region 100 in a fanout wiring mode, the first power supply line is configured to be connected with a high voltage power supply line (VDD) of the display region 100, and the second power supply line is configured to be connected with a low voltage power supply line (VSS) of the edge region 300. The first bending area 202 is disposed so that the transition connection area 203, the second bending area 204 and the bonding pin area 205 are bent to a side of the display region 100 facing away from a display side. The transition connection area 203 includes multiple connection lines which may be configured to transmit signals. The second bending area 204 is disposed so that the bonding pin area 205 is bent toward a surface of the display region 100 facing away from the display side. The bonding pin area 205 includes multiple bonding pads configured to be in bonding connection with an external circuit board.

Figure 2A:
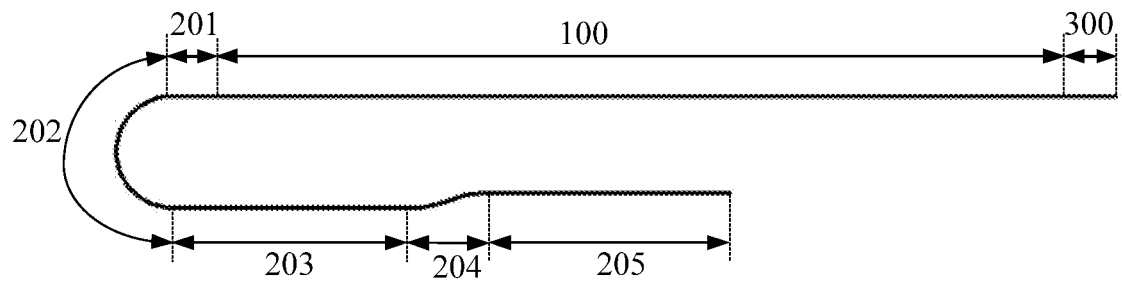
FIG. 2a is a schematic diagram of a structure of the display substrate of FIG. 1 with a first bending area and a second bending area in a bent state in some exemplary embodiments.
Figure 2B:
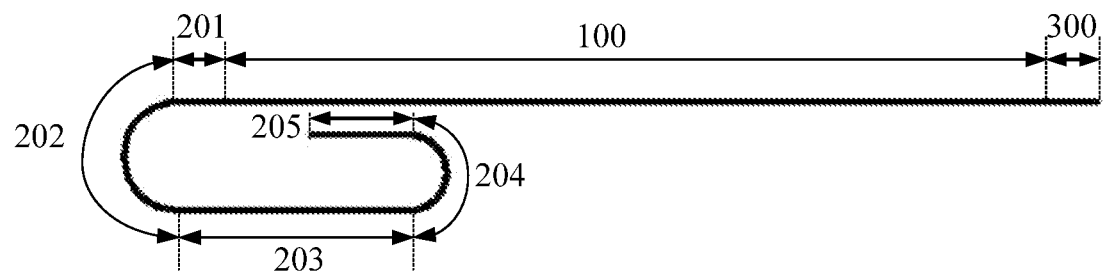
FIG. 2b is a schematic diagram of a structure of the display substrate of FIG. 1 with a first bending area and a second bending area in a bent state in some other exemplary embodiments.

In some exemplary embodiments, as shown in FIG. 2a and FIG. 2b, FIG. 2a is a schematic diagram of a structure of the display substrate of FIG. 1 in a bent state in a first bending area and a second bending area in some exemplary embodiments, and FIG. 2b is a schematic diagram of a structure of the display substrate of FIG. 1 in a bent state in the first bending area and the second bending area in some other exemplary embodiments. The display substrate includes a display region 100 and a bonding region 200 located on a side of the display region 100, the bonding region includes a wiring leading-out area 201, a first bending area 202, a transition connection area 203, a second bending area 204, and a bonding pin area 205 that are sequentially connected in a direction away from the display region 100. The transition connection area 203, the second bending area 204, and the bonding pin area 205 are bent through the first bending area 202 to the side of the display region 100 facing away from the display side. The bonding pin area 205 is bent toward a surface of the display region 100 facing away from the display side through the second bending area 204.

In some exemplary embodiments, as shown in FIG. 2a and FIG. 2b, the bonding pin area 205 is closer to the surface of the display region 100 facing away from the display side than the transition connection area 203.

In some exemplary embodiments, as shown in FIG. 2a and FIG. 2b, a first end of the second bending area 204 is connected to the transition connection area 203, and a second end of the second bending area 204 is connected to the bonding pin area 205, wherein the second end of the second bending area 204 is closer to the surface of the display region 100 facing away from the display side than the first end of the second bending area 204.

In some exemplary embodiments, the bonding pin area and the transition connection area may or may not overlap in a direction perpendicular to the display region.

Figure 13A:
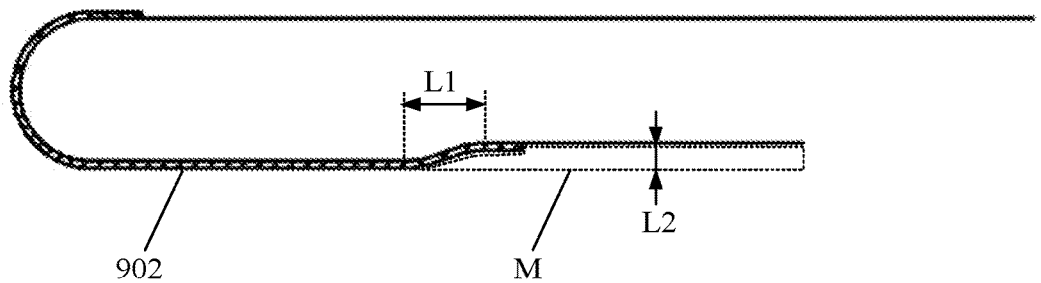
FIG. 13a is a schematic diagram of a structure in which the display substrate of FIG. 2a is provided with a stress protection layer in some exemplary embodiments.

In an example of this embodiment, as shown in FIG. 2a, the bonding pin area 205 and the transition connection area 203 do not overlap in the direction perpendicular to the display region 100, the second bending area 204 may be disposed obliquely to extend from an end (first end) connected to the transition connection area 203 toward a surface facing away from the display side of the display region 100, and a second end of the second bending area 204 is closer to the of the display region 100 surface facing away from the display side than the first end of the second bending area 204. The first bending area 202 may be provided to be in an arc surface shape. The transition connection area 203, the bonding pin area 205 and the display region 100 may be disposed in parallel with each other. In the example shown in FIG. 2a, the first end of the second bending area 204 is connected to the transition connection area 203, and the second end of the second bending area 204 is connected to the bonding pin area 205. A width (a distance indicated by L1 in FIG. 13a) between the first end of the second bending area 204 and the second end of the second bending area 204 may be more than 3 mm in a direction parallel to the display region 100. In the example of FIG. 2a, the second bending area 204 is disposed obliquely. In other examples, in the direction parallel to the display region 100, the second end of the second bending area 204 may be farther away from the transition connection area 203 than the first end of the second bending area 204, the second bending area 204 may be provided to be in an arc surface shape, and a protruding direction of the arc surface of the second bending area 204 may be toward or facing away from the display region 100.

In another example of this embodiment, as shown in FIG. 2b, the bonding pin area 205 and the transition connection area 203 overlap in the direction perpendicular to the display region 100, both the second bending area 204 and the first bending area 202 may be provided to be in an arc surface shape, a protruding direction of the arc surface of the second bending area 204 may be opposite to a protruding direction of the arc surface of the first bending area 202, and a bending radius of the first bending area 202 is larger than that of the second bending area 204. The bending radius of the first bending area 202 and the bending radius of the second bending area 204 may be from 0.2 mm to 0.4 mm. The second end (the end connected to the bonding pin area 205) of the second bending area 204 is closer to the surface of the display region 100 facing away from the display side than the first end (the end connected to the transition connection area 203) of the second bending area 204. The transition connection area 203, the bonding pin area 205 and the display region 100 may be disposed in parallel with each other.

When the display substrate of the embodiment of the present disclosure is applied to a flexible display module, film materials such as a support film and a heat dissipation film, etc. may be disposed on the back surface of the display region of the display substrate, and a polarizer and a cover plate may be disposed on the display side of the display region of the display substrate. The bonding region of the display substrate may be fixed on the heat dissipation film disposed on the back surface of the display region. The display substrate of the embodiment of the present disclosure may be applied to a flexible display screen, such as a foldable screen, a rollable screen, a sliding-rolling screen and the like.

In some exemplary embodiments, as shown in FIG. 2a, in the display substrate of this embodiment, the bonding region 200 may be bent twice by disposing the first bending area 202 and the second bending area 204, and the bonding pin area 205 is bent toward the surface of the display region 100 facing away from the display side by disposing the second bending area 204. Therefore, compared with some display substrates without the second bending area, space (the space is the area indicated by the dotted line frame M in FIG. 13a, and L2 represents a thickness of the space in the direction perpendicular to the display region 100) on a side of the bonding region 200 facing away from the display region 100 may be saved, and when the display substrate of this embodiment is applied to a flexible display module, a thickness of the flexible display module in the direction perpendicular to the display region 100 may be reduced, a volume of the flexible display mod may be reduced, and the space occupied by the flexible display module may be saved, which is beneficial to an optimal design of the whole machine space. In the display substrate as shown in FIG. 2b, the bonding pin area 205 is bent into a space between a back surface of a display region 100 and a surface of a transition connection area 203 toward the display region 100 through a second bending area 204, Therefore, when the display substrate of this embodiment is applied to a flexible display module, a thickness of the flexible display module in a direction perpendicular to the display region 100 may be reduced to a greater extent, a volume of the flexible display module may be reduced, save the space occupied by the flexible display module, and the space occupied by the flexible display module may be saved, which is beneficial to the optimal design of the whole machine space.

Figure 3:
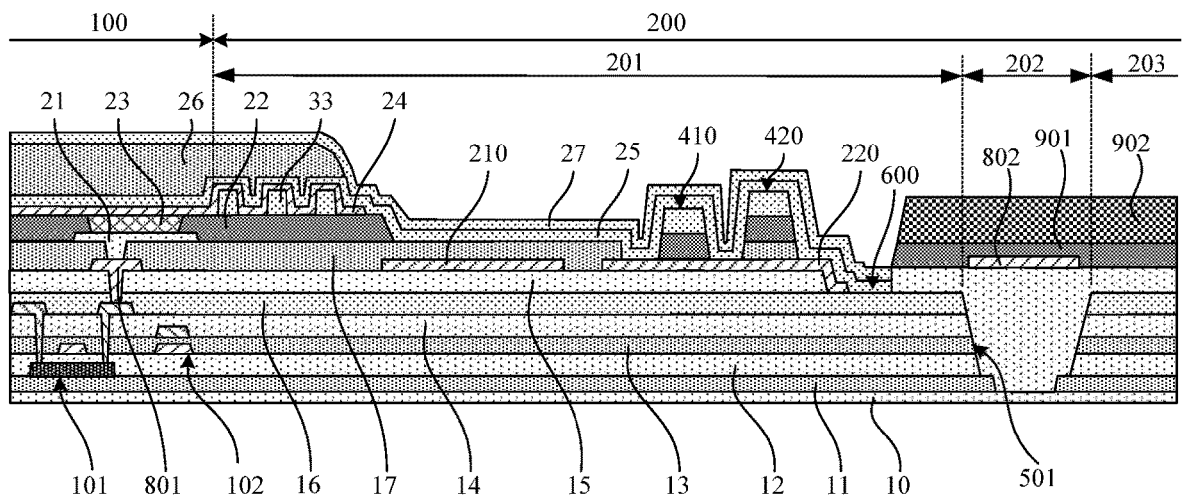
FIG. 3 is a schematic diagram of a cross-sectional structure along A-A of a display substrate in FIG. 1 in some exemplary embodiments.

In some exemplary embodiments, as shown in FIG. 3, FIG. 3 is a schematic diagram of a cross-sectional structure along A-A of a display substrate in FIG. 1 in some exemplary embodiments, wherein the display substrate includes a display region 100 and a bonding region 200 located on a side of the display region 100. In the cross-sectional diagram of FIG. 3, a light emitting element of the display region 100 is shown, and a partial area of a wiring leading-out area 201, a first bending area 202 and a transition connection area 203 of the bonding region 200 close to the first bending area 202 is shown.

Exemplarily, as illustrated in FIG. 3, the display region 100 includes a flexible base substrate 10, a drive structure layer, a light emitting structure layer and an encapsulation structure layer disposed sequentially on the flexible base substrate 10. The drive structure layer includes a pixel drive circuit, and the light emitting structure layer includes a light emitting element connected with the pixel drive circuit, wherein the light emitting element may be an organic light-emitting diode (OLED) device. The light emitting structure layer includes multiple the light emitting elements, and each light emitting element is connected to a corresponding pixel drive circuit. Exemplarily, the drive structure layer of the display region 100 includes multiple transistors and storage capacitors forming a pixel drive circuit, which is illustrated by taking one transistor 101 and one storage capacitor 102 as an example in FIG. 3. The drive structure layer of the display region 100 includes: a first insulation layer 11 disposed on the flexible base substrate 10, an active layer disposed on the first insulation layer 11, a second insulation layer 12 overlying the active layer, a first gate metal layer disposed on the second insulation layer 12, a third insulation layer 13 covering the gate metal layer, a second gate metal layer disposed on the third insulation layer 13, a fourth insulation layer 14 overlying the second gate metal layer, a source-drain metal layer disposed on the fourth insulation layer 14, a fifth insulation layer 16 overlying the source-drain metal layer, a first planarization layer 15 disposed on the fifth insulation layer 16, and a metal conductive layer disposed on the first planarization layer 15. Among them, the first gate metal layer includes a gate electrode and a first capacitor electrode, the second gate metal layer includes a second capacitor electrode, the source-drain metal layer includes a source electrode and a drain electrode, and the metal conductive layer includes a connection electrode 801 connected to a drain electrode of the transistor 101 through a via hole. The active layer, the gate electrode, the source electrode, and the drain electrode form the transistor 101, and the first capacitance electrode and the second capacitance electrode form the storage capacitor 102. In some embodiments, the source-drain metal layer is referred to as a first source-drain metal layer (SD1), and the metal conductive layer is referred to as a second source-drain metal layer (SD2). A second planarization layer 17 is provided on the drive structure layer of the display region 100, wherein the second planarization layer 17 overlays the metal conductive layer.

Exemplarily, as shown in FIG. 3, the light emitting structure layer 103 may include an anode 21, a pixel definition layer 22, a cathode 24 and an organic light emitting layer 23 located between the anode 21 and the cathode 24. The anode 21 is disposed on the second planarization layer 17, and is connected to the connection electrode 801 through a via hole provided on the second planarization layer 17 to achieve a connection between the anode 21 and the drain electrode of the transistor 101. The pixel definition layer 22 is disposed on the anode 21 and the second planarization layer 17, and a pixel opening is provided on the pixel definition layer 22, wherein the pixel opening exposes the anode 21. The organic light emitting layer 23 is at least partially disposed within the pixel opening and is connected to the anode 21, and the cathode 24 is disposed on the organic light emitting layer 23 and is connected to the organic light emitting layer 23. The light emitting structure layer includes multiple light emitting elements disposed on the second planarization layer 17, each of the light emitting elements includes the anode 21, the organic light emitting layer 23 and the cathode 24 which are stacked sequentially. The encapsulation structure layer includes a first encapsulation layer 25, a second encapsulation layer 26 and a third encapsulation layer 27 which are stacked, wherein the second encapsulation layer 26 of an organic material is disposed between the first encapsulation layer 25 of an inorganic material and the third encapsulation layer 27 of an inorganic material.

Exemplarily, as shown in FIG. 3, the wiring leading-out area 201 may include a flexible base substrate 10, a bonding structure layer (including metal wiring) disposed on the flexible base substrate 10, the second planarization layer 17 disposed on the bonding structure layer, a first isolation dam 410 and a second isolation dam 420, and an inorganic encapsulation layer (the first encapsulation layer 25 and the third encapsulation layer 27) overlying the second planarization layer 17, the first isolation dam 410 and the second isolation dam 420. The bonding structure layer may include an inorganic composite insulation layer disposed on the flexible base substrate 10, the first planarization layer 15 disposed on the inorganic composite insulation layer, and a first power supply line 210 and a second power supply line 220 disposed on the first planarization layer 15. The inorganic composite insulation layer may include a first insulation layer 11, a second insulation layer 12, a third insulation layer 13, a fourth insulation layer 14, and a fifth insulation layer 16 sequentially stacked on the flexible base substrate 10. The first power supply line 210 and the second power supply line 220 may be disposed in a same layer as the metal conductive layer of the display region 100 and formed by a same patterning process. In other examples, the first power supply line and the second power supply line may be formed on the fourth insulation layer 14, disposed in a same layer as the source-drain metal layer of the display region, and formed by a same patterning process. At a position where the second power supply line is located, the first isolation dam and the second isolation dam are disposed on the second power supply line by removing the fifth insulation layer, the first planarization layer and the second planarization layer in some areas. A partition groove 600 exposing the fifth insulation layer 16 may be provided on the first planarization layer 15 of the wiring leading-out area 201 close to the first bending area 202, a second planarization layer 17 is disposed on a side of the partition groove 600 close to the display region 100 and exposes a surface of the second power supply line 220, and both the first isolation dam 410 and the second isolation dam 420 may be disposed on the second power supply line 220. The inorganic encapsulation layer includes first encapsulation layer 25 and third encapsulation layer 27 which are stacked, the first encapsulation layer 25 and the third encapsulation layer 27 overlays the second planarization layer 17, the second power supply line 220, and the fifth insulation layer 16 exposed by the partition groove 600, and wrap the first isolation dam 410 and the second isolation dam 420. In addition, a pixel definition layer 22 is provided on the second planarization layer 17 of the wiring leading-out area 210 adjacent to the display region 100, multiple post spacers 33 are provided on the pixel definition layer 22 at intervals, and the cathode 24 wraps the multiple post spacers 33.

Exemplarily, as shown in FIG. 3, the first bending area 202 may include an inorganic composite insulation layer disposed on the flexible base substrate 10, wherein the inorganic composite insulation layer is provided with a first groove 501 exposing the flexible base substrate 10, and the first bending area 202 further includes a first organic layer disposed on the inorganic composite insulation layer and filling the first groove 501 (in some examples, the first organic layer may be disposed in a same layer as the first planarization layer 15 of the display region 100 and formed by a same patterning process), a first connection line 802 disposed on the first organic layer, a second organic layer 901 disposed on the first organic layer and overlying the first connection line 802 (in some examples, the second organic layer may be disposed on q same layer as the pixel definition layer 22 of the display region 100 and formed by a same patterning process), and a stress protection layer 902 disposed on the second organic layer 901. The stress protection layer 902, the second organic layer 901, and the first organic layer of the first bending area 202 are configured such that the first connection line 802 is located on a neutral layer (the neutral layer is not stretched or compressed during the bending) during the bending of the first bending area 202, thereby preventing a metal line of a metal wiring layer where the first connection line 802 of the first bending area 202 is located from breaking.

The cross-sectional diagram of FIG. 3 does not show the entirety of the transition connection area, the second bending area and the bonding pin area. A film layer structure of the second bending area may be the same as that of the first bending area, the second bending area may include an inorganic composite insulation layer disposed on the flexible base substrate, wherein the inorganic composite insulation layer is provided with a second groove exposing the flexible base substrate. The second bending area further includes a first organic layer disposed on the inorganic composite insulation layer and filling the second groove (in some examples, the first organic layer may be disposed in a same layer as the first planarization layer of the display region and formed by a same patterning process), a second connection line disposed on the first organic layer, a second organic layer disposed on the first organic layer and overlying the second connection line (in some examples, the second organic layer may be disposed in a same layer as the pixel definition layer of the display region and formed by a same patterning process), and a stress protection layer disposed on the second organic layer. The stress protection layer, the second organic layer and the first organic layer of the second bending area are configured such that the second connection line is located on a neutral layer during bending of the second bending area, thereby preventing a metal line of a metal wiring layer where the second connection line of the second bending area is located from breaking. The first connection line of the first bending area and the second connection line of the second bending area may be disposed in a same layer and formed simultaneously by a same patterning process.

A structure of the display substrate according to the present disclosure will be described below through an example of a preparation process of the display substrate. A "patterning process" mentioned in the present disclosure includes processes such as deposition of a film layer, photoresist coating, mask exposure, development, etching, and photoresist stripping. The deposition may be any one or more of sputtering, evaporation, and chemical vapor deposition, coating may be any one or more of spray coating and spin coating, and the etching may be any one or more of dry etching and wet etching. A "thin film" refers to a layer of a thin film prepared from a material on a base substrate using a process of deposition or coating. If the "thin film" does not need a patterning process in the entire manufacturing process, the "thin film" may also be called a "layer". If the "thin film" needs a patterning process in the entire manufacturing process, the "thin film" is called a "thin film" before the patterning process and is called a "layer" after the patterning process. The "layer" after the patterning process includes at least one "pattern". "A and B are disposed in a same layer" mentioned in the present disclosure means that A and B are simultaneously formed through a same patterning process. "An orthographic projection of A contains an orthographic projection of B" means that the orthographic projection of B falls within a range of the orthographic projection of A, or the orthographic projection of A covers the orthographic projection of B.

Figure 4:
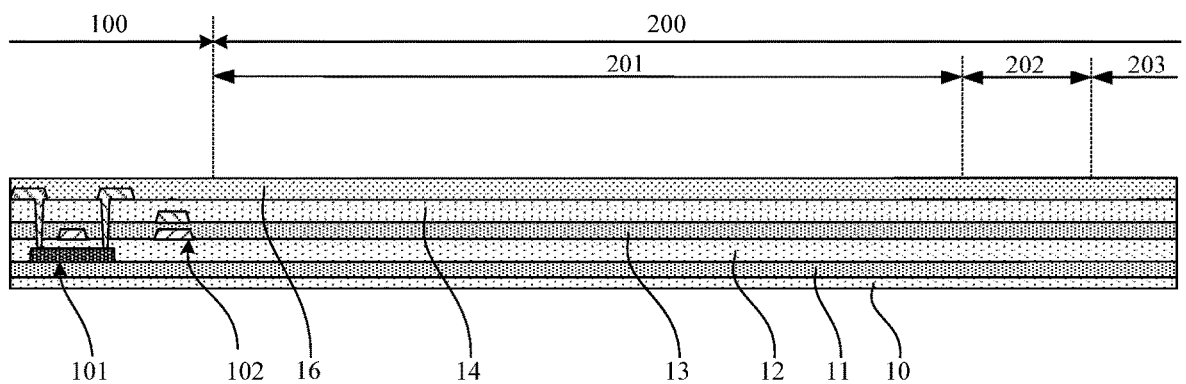
FIG. 4 is a schematic diagram of a structure after a drive structure layer and a bonding structure layer are formed during preparation of the display substrate of FIG. 3.

With reference to FIG. 3-FIG. 12, a preparation process of the display substrate includes steps (1)-(9):

(1) A flexible base substrate 10 is prepared on a glass carrier plate 1. The flexible base substrate 10 may include a first flexible material layer, a first inorganic material layer, a semiconductor layer, a second flexible material layer, and a second inorganic material layer which are stacked sequentially. A material of the first flexible material layer and the second flexible material layer may be Polyimide (PI), Polyethylene Terephthalate (PET), or a polymer soft film subjected to surface treatment, etc. A material of the first inorganic material layer and the second inorganic material layer may be Silicon Nitride (SiNx) or Silicon Oxide (SiOx), etc., which may be used for improving water and oxygen resistance of the base substrate. The first inorganic material layer and the second inorganic material layer may be referred to as barrier layers. A material of the semiconductor layer may be amorphous silicon (a-si) which may improve an adhesive force between the first inorganic material layer and the second flexible material layer. In other examples, the flexible base substrate 10 may include a single-layer flexible material and a single-layer inorganic material. In some exemplary embodiments, taking a stacked structure PI1/Barrier1/a-si/PI2/Barrier2 as an example, a preparation process of the flexible base substrate 10 may include: firstly coating a layer of polyimide on a glass carrier plate 1, and curing it into a film to form a first flexible (PI1) layer; then depositing a layer of barrier thin film on the first flexible layer to form a first barrier (Barrier1) layer overlying the first flexible layer; then depositing a layer of amorphous silicon thin film on the first barrier layer to form an amorphous silicon (a-si) layer overlying the first barrier layer; then coating a layer of polyimide on the amorphous silicon layer, and curing it into a film to form a second flexible (PI2) layer; and then depositing a barrier thin film on the second flexible layer to form a second barrier (Barrier2) layer overlying the second flexible layer, thus completing the preparation of the flexible base substrate 10. After this process, both the display region 100 and the bonding region 200 include the flexible base substrate 10, as shown in FIG. 4.

(2) A drive structure layer is formed in the display region 100, and a bonding structure layer is formed in the bonding region 200. The drive structure layer of the display region 100 includes a transistor 101, a capacitor electrode 102 and a connection electrode 801; the bonding structure layer of the bonding region 200 includes a first power supply line 210 and a second power supply line 220 of a wiring leading-out area 201, and a first connection line 802 of the first bending area 202 and a second connection line of the second bending area. In an exemplary embodiment, a preparation process of the drive structure layer may include the following operations.

A first insulation layer 11 and an active layer disposed on the first insulation layer 11 is formed on the flexible base substrate 10.

A pattern of a second insulation layer 12 and a pattern of a first gate metal layer disposed on the second insulation layer 12 are formed, wherein the first gate metal layer includes a gate electrode, a first capacitor electrode and a gate line, etc.

A pattern of a third insulation layer 13 overlying the first gate metal layer and a pattern of a second gate metal layer disposed on the third insulation layer 13 are formed, wherein the pattern of the second gate metal layer includes a second capacitor electrode.

A pattern of a fourth insulation layer 14 overlying the second gate metal layer is formed, wherein two first via holes penetrating through the active layer are provided on the fourth insulation layer 14. A pattern of a source-drain metal layer is formed on the fourth insulation layer 14, wherein the source-drain metal layer includes a source electrode connected to the active layer through one of the first via holes, and a drain electrode connected to the active layer through the other first via hole. Then, a fifth insulation layer 16 overlying the source-drain metal layer is formed, as shown in FIG. 4, wherein the active layer, the gate electrode, the source electrode and the drain electrode of the display region 100 constitute a transistor 101, and the first capacitor electrode and the second capacitor electrode constitute a storage capacitor 102.

Figure 5:
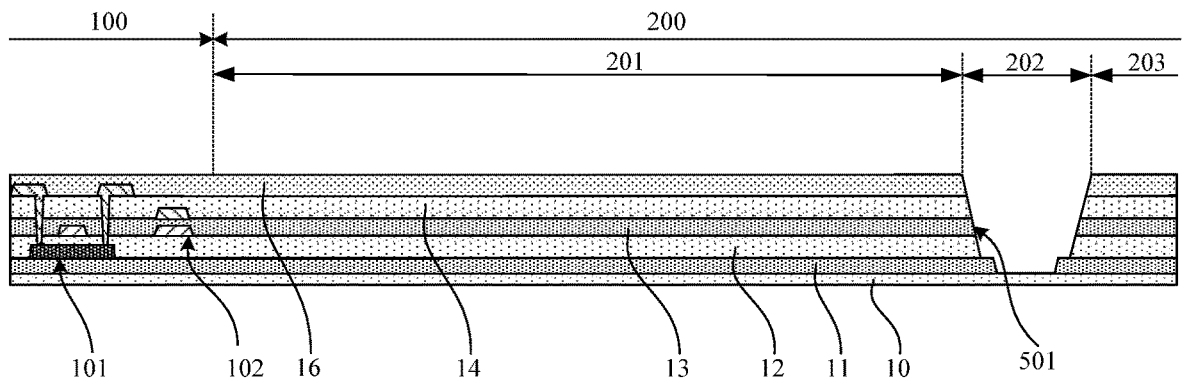
FIG. 5 is a schematic diagram of a structure after a groove is formed in the first bending area during the preparation of the display substrate of FIG. 3.

A first groove 501 penetrating through the first insulation layer 11 is provided on the fifth insulation layer 16 of the first bending area 202, and a second groove penetrating through the first insulation layer is provided on the fifth insulation layer of the second bending area, wherein both the first groove 501 and the second groove expose the flexible base substrate 10. The methods for forming the first groove 501 and the second groove may be the same. Taking the first groove 501 as an example, it may be formed by two patterning processes. First, the fifth insulation layer 16, the fourth insulation layer 14, the third insulation layer 13 and the second insulation layer 12 of the first bending area 202 are etched by an Etch Bending A MASK (EBA MASK for short) to form a first penetration groove exposing a surface of the first insulation layer 11, and then the first insulation layer 11 exposed by the first penetration groove is etched by an Etch Bending B MASK (EBB MASK for short) to form a second penetration groove on the first insulation layer 11, and the second penetration groove exposes a surface of the base substrate 10. Thus, the first penetration groove exposes the second penetration groove which exposes the base substrate 10, forming a stepped first groove 501, as shown in FIG. 5.

Figure 6:
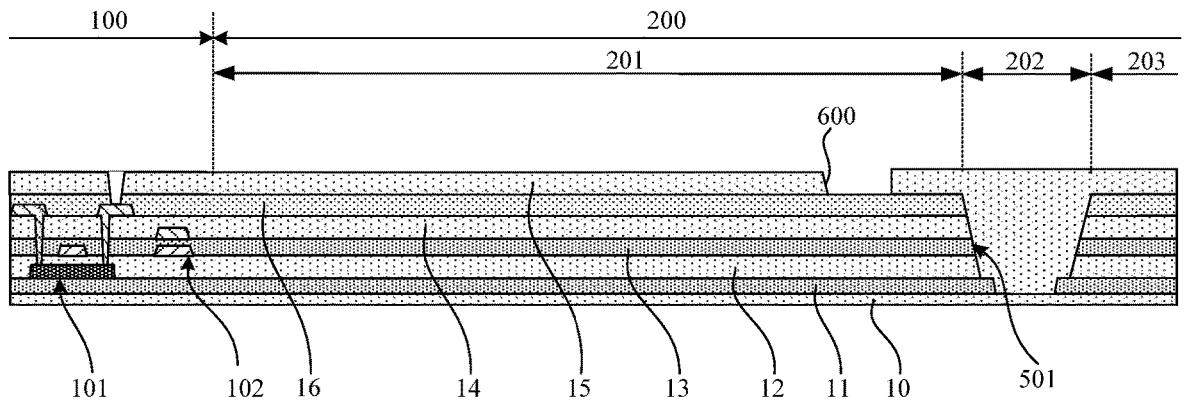
FIG. 6 is a schematic diagram of a structure after a first planarization layer is formed during the preparation of the display substrate of FIG. 3.

A first planarization thin film of an organic material is coated on the fifth insulation layer 16 and a pattern of a first planarization layer 15 is formed by a patterning process. A second via hole exposing the drain electrode of the transistor 101 is formed on the first planarization layer 15 of the display region 100, a partition groove 600 exposing the fifth insulation layer 16 is formed on the first planarization layer 15 of the wiring leading-out area 201, the first planarization layer 15 of the first bending area 202 fills the first groove 501, and the first planarization layer 15 of the second bending area fills the second groove, as shown in FIG. 6. A first groove 501 is disposed on the inorganic composite insulation layer of the first bending area 202, a second groove is disposed on the inorganic composite insulation layer of the second bending area, wherein both the first groove 501 and the second groove are filled with a first planarization layer 15 of an organic material (in this example, the first planarization layer 15 in the first bending area 202 and the second bending area is the first organic layer in the first bending area 202 and the second bending area), which facilitates bending of the first bending area 202 and the second bending area.

Figure 7:
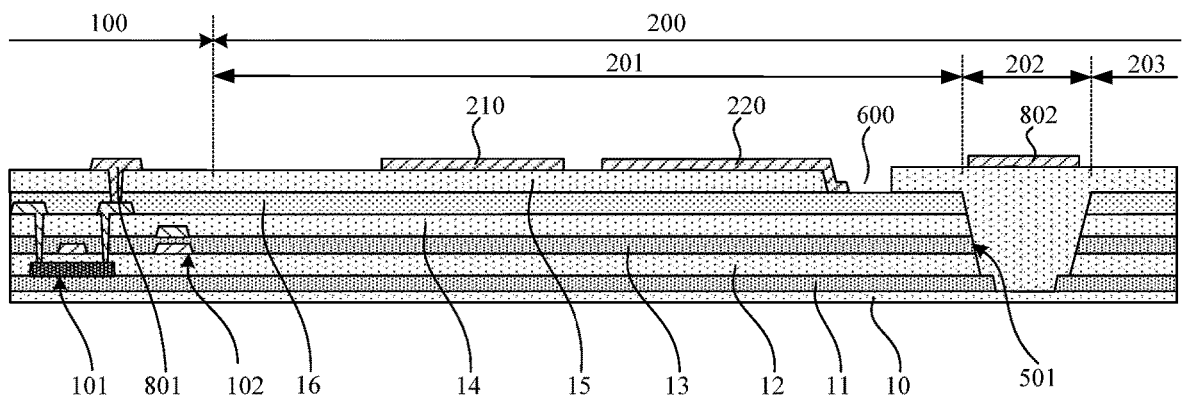
FIG. 7 is a schematic diagram of a structure after a metal conductive layer is formed during the preparation of the display substrate of FIG. 3.

A pattern of a metal conductive layer is formed on the first planarization layer 15, wherein the metal conductive layer includes a connection electrode 801 formed in the display region 100, a first power supply line 210 and a second power supply line 220 formed in the wiring leading-out area 210, a first connection line 802 formed in the first bending area 202, and a second connection line formed in the second bending area. Among them, the connection electrode 801 is connected to the drain electrode of the transistor 101 through the second via hole and an edge of the second power supply line 220 away from the display region 100 may be located in the partition groove 600 of the first planarization layer 15, as shown in FIG. 7. The first connection line 802 of the first bending area 202 is configured to conduct signal connection between the wiring leading-out area 210 and the transition connection area 203, and the second connection line of the second bending area is configured to be in signal connection with the transition connection area and the bonding pin area.

Figure 8:
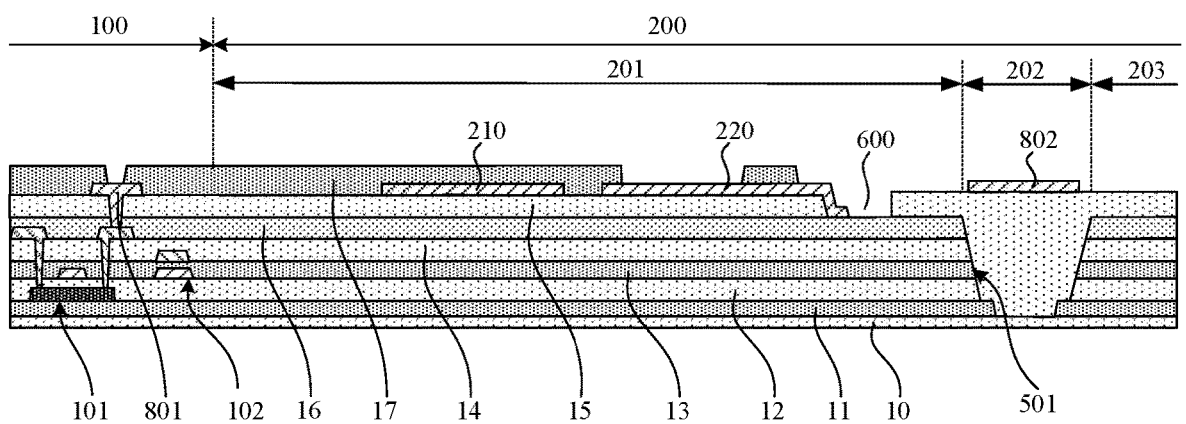
FIG. 8 is a schematic diagram of a structure after a second planarization layer is formed during the preparation of the display substrate of FIG. 3.

(3) A pattern of a second planarization layer 17 is formed in the wiring leading-out area 201 of the display region 100 and the bonding region 200. A third via hole is provided on the second planarization layer 17 of the display region 100, wherein the third via hole exposes a surface of the connection electrode 801. The second planarization layer 17 of the wiring leading-out area 201 is disposed on a side of the partition groove 600 close to the display region 100 to cover the first power supply line 210 and expose a surface of the second power supply line 220, and the second planarization layer 17 of the wiring leading-out area 201 further includes a planarization foundation formed on the second power supply line 220, as shown in FIG. 8.

Figure 9:
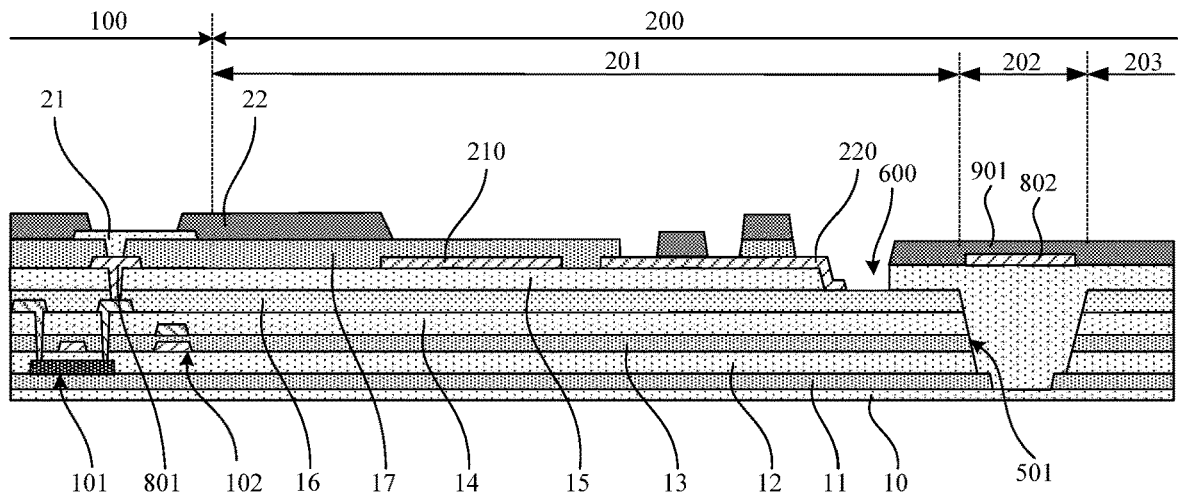
FIG. 9 is a schematic diagram of a structure after an anode and a pixel definition layer are formed during the preparation of the display substrate of FIG. 3.

(4) A pattern of an anode 21 is formed on the base substrate on which the above patterns are formed. The anode 21 is disposed on the second planarization layer 17 of the display region 100, and the anode 21 is connected with the connection electrode 801 through the third via hole, as shown in FIG. 9.

(5) A pixel definition thin film is coated on the base substrate with the foregoing patterns formed thereon, and the pixel definition thin film is patterned to form patterns of a pixel definition layer (PDL) 22, a first dam foundation, a second dam foundation and a second organic layer 901. In the display region 100, a pixel opening is provided on the pixel definition layer 22, wherein the pixel opening exposes a surface of the anode 21. The first dam foundation and the second dam foundation are formed in the wiring leading-out area 201 of the bonding region 200, wherein the first dam foundation is formed on the second power supply line 220, and the second dam foundation is formed on the planarization dam foundation. A second organic layer 901 is formed at least in the first bending area 202 and the second bending area and overlays the first connection line 802 and the second connection line, as shown in FIG. 9.

Figure 10:
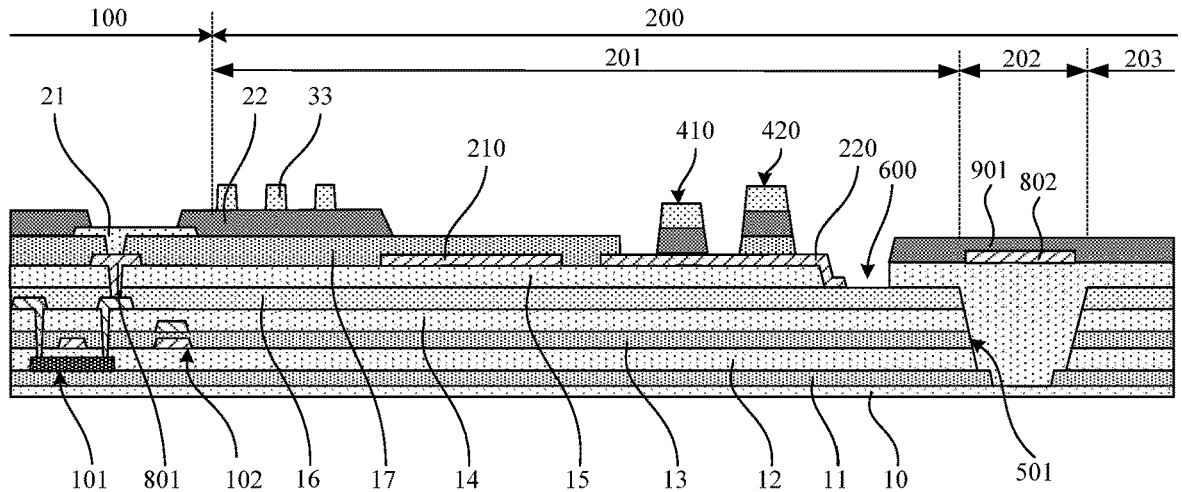
FIG. 10 is a schematic diagram of a structure after post spacers are formed during the preparation of the display substrate of FIG. 3.

(6) Patterns of multiple post spacers 33 are formed in the bonding region 200, wherein the multiple post spacers 33 are disposed on the pixel definition layer 22, the first dam foundation and the second dam foundation of the wiring leading-out area 201. The first dam foundation and the post spacer 33 on the first dam foundation form a first support dam 410, and the planarization dam foundation, the second dam foundation and the post spacer 33 on the second dam foundation form a second support dam 420. The bonding region 200 and the edge region 300 may synchronously form the first support dam 410 and the second support dam 420, wherein the first support dam 410 of the bonding region 200 and the edge region 300 is an integral ring structure, and the second support dam 420 of the bonding region 200 and the edge region 300 is an integral ring structure. The first support dam 410 and the second support dam 420 may surround the display region 100, which prevents external water vapor from entering the display region 100, as shown in FIG. 10.

Figure 11:
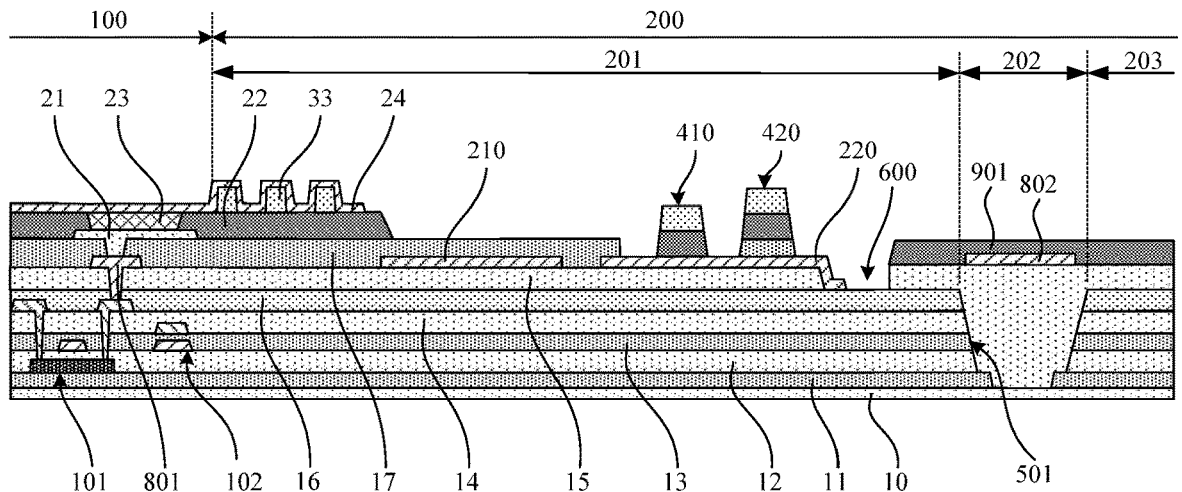
FIG. 11 is a schematic diagram of a structure after an organic light emitting layer and a cathode are formed during the preparation of the display substrate of FIG. 3.

(7) An organic light emitting layer 23 and a cathode 24 on the base substrate with the above patterns formed thereon is formed sequentially. The organic light emitting layer 23 is formed in the pixel opening of the pixel defining layer 22 and connected to the anode 21. A portion of the cathode 24 is formed on the organic light emitting layer 23 and the pixel defining layer 22 of the display region 100, and the other portion of the cathode 24 is formed in the wiring leading-out area 201, wherein the cathode 24 of the wiring leading-out area 201 wraps the multiple the spacer posts 33 on the pixel defining layer 22, as shown in FIG. 11.

Figure 12:
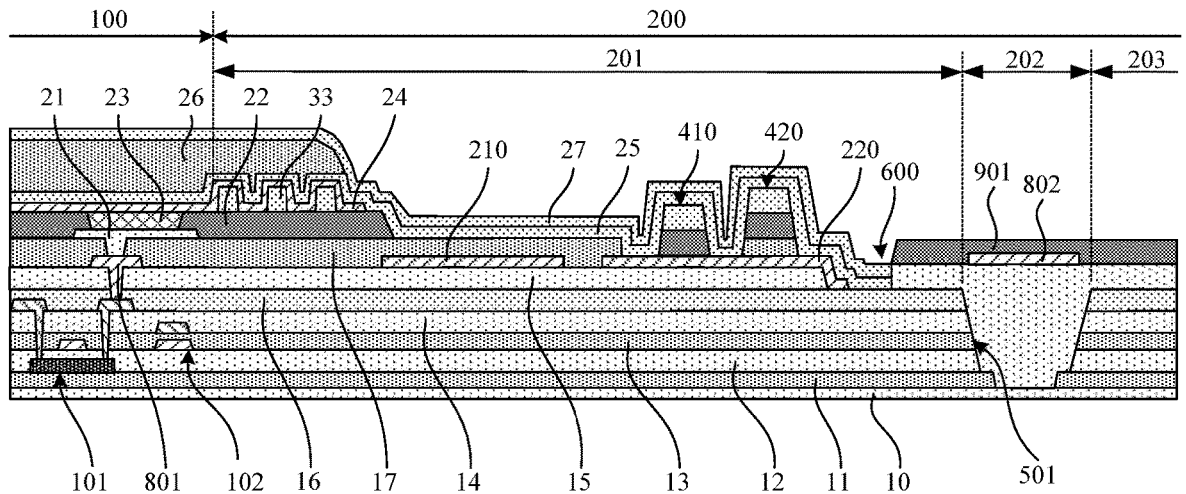
FIG. 12 is a schematic diagram of a structure after an encapsulation structure layer is formed during the preparation of the display substrate of FIG. 3.

(8) An encapsulation layer is formed on the basis of forming the above patterns, wherein the encapsulation layer includes a first encapsulation layer 25, a second encapsulation layer 26 and a third encapsulation layer 27 which are stacked. The first encapsulation layer 25 and the third encapsulation layer 27 are made of an inorganic material, and the second encapsulation layer 26 is made of an organic material. In the display region 100, the first encapsulation layer 25 overlays the cathode 24, and in the wiring leading-out area 201, the first encapsulation layer 25 wraps the multiple the spacer posts 33, overlays the second planarization layer 17, and wraps the first support dam 410 and the second support dam 420. The first encapsulation layer 25 is further formed on the fifth insulation layer 16 exposed by the partition groove 600, and is contact with the fifth insulation layer 16 exposed by the partition groove 600, so that the encapsulation effect may be improved. The second encapsulation layer 26 is disposed in the display region 100 and an area of the wiring leading-out area 201 where the post spacers 33 are located. The third encapsulation layer 27 overlays the first encapsulation layer 25 and the second encapsulation layer 26, as shown in FIG. 12.

(9) A stress protection layer 902 is formed on the basis of forming the foregoing pattern, wherein a material of the stress protection layer 902 may be an organic material, which may be coated on the first bending area 202 and the second organic layer 901 of the second bending area of the bonding region 200 by a coating process and formed by curing, as shown in FIG. 3. The stress protection layer 902 enables the metal wiring layer where the first connection line 802 of the first bending area 202 is located to be in a neutral layer, such that the metal wiring layer where the second connection line of the second bending area is located is in the neutral layer, thereby preventing the metal wires of the metal wiring layer from being broken by stretch or compression when the first bending area 202 and the second bending area are bent.

Figure 13B:
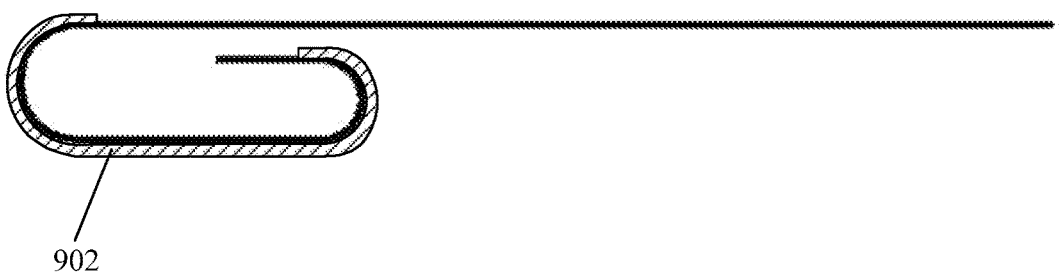
FIG. 13b is a schematic diagram of a structure in which the display substrate of FIG. 2b is provided with a stress protection layer in some exemplary embodiments.
Figure 14A:
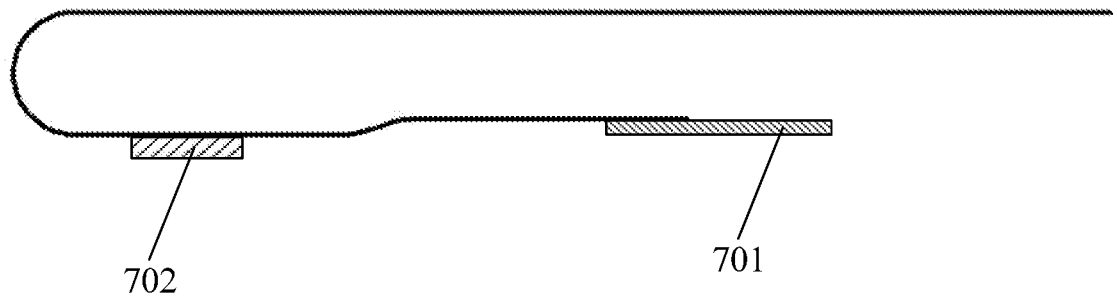
FIG. 14a is a schematic diagram of a structure in which a driver chip and a flexible circuit board are in bonding connection with the display substrate of FIG. 2a in some exemplary embodiments.
Figure 14B:
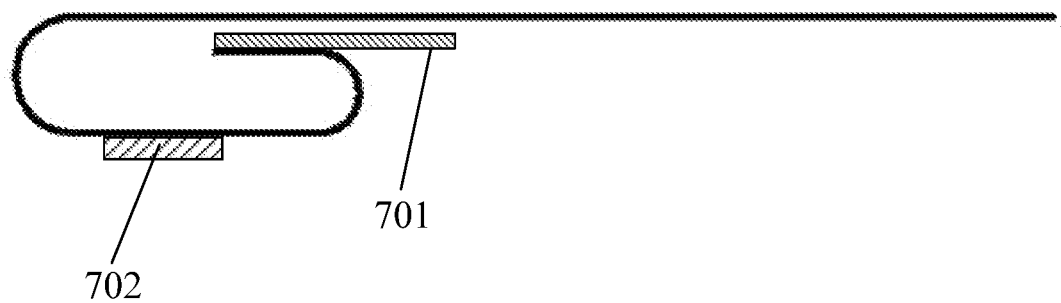
FIG. 14b is a schematic diagram of a structure in which a driver chip and a flexible circuit board are in bonding connection with the display substrate of FIG. 2b in some exemplary embodiments.
Figure 15A:
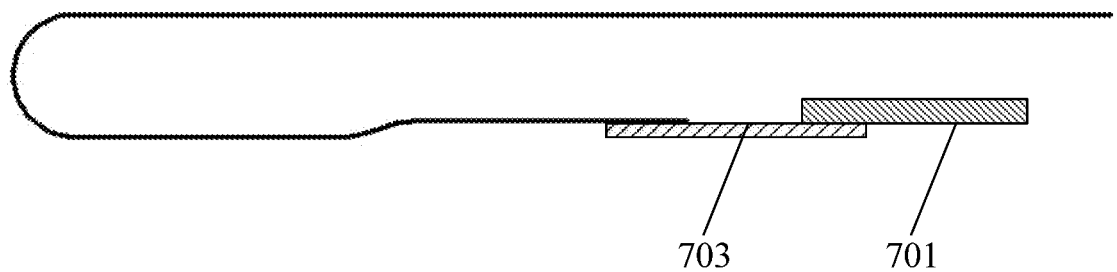
FIG. 15a is a schematic diagram of a structure in which a driver chip and a flexible circuit board are in bonding connection with the display substrate of FIG. 2a in other exemplary embodiments.
Figure 15B:
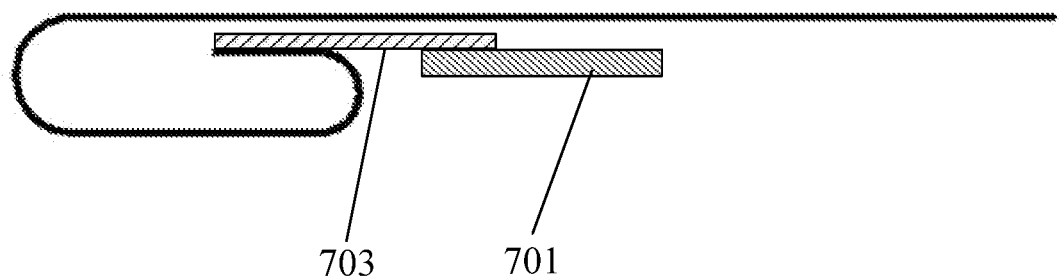
FIG. 15b is a schematic diagram of a structure in which a driver chip and a flexible circuit board are in bonding connection with the display substrate of FIG. 2b in some exemplary embodiments.

In some exemplary embodiments, as shown in FIG. 2a, FIG. 2b, FIG. 13a and FIG. 13b, FIG. 13a is a schematic diagram of a structure of the display substrate of FIG. 2A provided with a stress protection layer in some exemplary embodiments, FIG. 13b is a schematic diagram of a structure of the display substrate of FIG. 2b provided with a stress protection layer in some exemplary embodiments, both the first bending area 202 and the second bending area 204 are provided with the stress protection layer 902, and the stress protection layer 902 of the first bending area 202 and the stress protection layer 902 of the second bending area 204 are connected integrally. An orthographic projection of the stress protective layer 902 of the bonding region 200 on the base substrate 10 may contain an orthographic projection of the first connection line of the first bending area 202 and the second connection line of the second bending area 204 on the base substrate 10. In an example of this embodiment, as shown in FIG. 2a, FIG. 2b, FIG. 13a and FIG. 13b, the transition connection area 203 may be provided with a stress protection layer 902, and the stress protection layers 902 of the first bending area 202, the transition connection area 203 and the second bending area 204 are integrally connected and disposed in a same layer, and formed by a same coating process. The stress protection layer 902 may extend to an edge region of the wiring leading-out area 201 close to the first bending area 202, and may extend to an edge region of the bonding pin area 205 close to the second bending area 204. When the display substrate is in a unbent and flattened state, the edge of the stress protection layer 902 may exceed an edge of the first bending area 202 close to the display region 100 by more than 0.15 microns, and may exceed the edge of the second bending area 204 away from the display region 100 by more than 0.15 microns, so that the first bending area 202 and the second bending area 204 can be adequately protected. In the display substrate illustrated in FIG. 2a, the transition connection area 203, the second bending area 204, and the bonding pin area 205 may first be bent to a side facing away from a display side of the display region 100 along the first bending area 202, then the bonding pin area 205 may be bent toward a surface facing away from a display side of the display region 100 along the second bending area 204, and the display substrate has been provided with the stress protection layer 902 before bending. In the display substrate illustrated in FIG. 2b, the bonding pin area 205 may first be bent to a back side of the transition connection area 203 along the second bending area 204, then the transition connection area 203, the second bending area 204 and the bonding pin area 205 may be bent to a side facing away from the display side of the display region 100 along the first bending area 202, and the display substrate has been provided with a stress protection layer 902 before bending.

In some exemplary embodiments, a thickness of the protection layer may be 90 microns to 120 microns. An elastic modulus of the stress protective layer may be 200 MPa to 300 MPa. A material of the stress protection layer is a curing adhesive, for example, an ultraviolet curing protective adhesive (e.g., micro coating layer (MCL) adhesive) or a polyester urethane adhesive, etc.

In some exemplary embodiments, the display substrate of the embodiment of the present disclosure may further include an external circuit board and a driver chip (or driver IC) which are in bonding connection with the bonding region. The external circuit board may be a flexible circuit board, which may be in bonding connection with the bonding pin area. The driver chip may be disposed to avoid the second bending area, and may be directly in bonding connection with the transition connection area or the bonding pin area, or the driver chip may be in bonding connection with the bonding pin area through a chip on film (COF for short). The external circuit board may be connected with an external drive apparatus to provide a drive signal to the display substrate. In an example of this embodiment, as shown in FIG. 2a, FIG. 2b, FIG. 14a and FIG. 14b, the display substrate may further include an external circuit board 701 which is in bonding connection with the bonding pin area 205, and a driver chip 702 which is in bonding connection with the transition connection area 203, and the external circuit board 701 may be a flexible circuit board. In an example of this embodiment, as shown in FIG. 2a, FIG. 2b, FIG. 15a and FIG. 15b, the display substrate may further include a chip on film 703 which is in bonding connection with the bonding pin area 205, and an external circuit board 701 which is in bonding connection with the chip on film 703, wherein the external circuit board 701 may be a flexible circuit board. The chip on film 703 includes a thin film circuit board body and a driver chip in bonding connection with the thin film circuit board body.

An embodiment of the present disclosure further provides a display apparatus which includes the display substrate in any one of the aforementioned embodiments. The display apparatus may be any product or component with a display function, such as a mobile phone, a tablet computer, a television, a display, a laptop computer, a digital photo frame, or a navigator.

In the accompanying drawings, a size of a constituent element, and a thickness of a layer or an area are sometimes exaggerated for clarity. Therefore, one implementation of the present disclosure is not necessarily limited to the size, and the shape and size of each component in the drawings do not reflect an actual scale. In addition, the drawings schematically illustrate some examples, and one implementation of the present disclosure is not limited to the shapes or numerical values shown in the drawings.

In the description herein, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the description herein, orientation or position relationships indicated by the terms such as "upper", "lower", "left", "right", "top", "inside", "outside", "axial", "tetragonal" and the like are orientation or position relationships shown in the drawings, and are intended to facilitate description of the embodiments of the present disclosure and simplification of the description, but not to indicate or imply that the mentioned structure has a specific orientation or be constructed and operated in a specific orientation, therefore, they should not be understood as limitations on the present disclosure.

In the description herein, unless otherwise specified and defined explicitly, the terms "connection", "fixed connection", "installation" and "assembly" should be understood in a broad sense, and, for example, may be a fixed connection, a detachable connection or an integrated connection; the terms "installation", "connection" and "fixed connection" may be a direct connection, an indirect connection through intermediate components, or communication inside two components. For those ordinarily skilled in the art, meanings of the above terms in the embodiments of the present disclosure can be understood according to situations.

The invention claimed is:

1. A display substrate, comprising a display region and a bonding region located on a side of the display region, wherein the bonding region comprises a first bending area close to the display region, and a transition connection area, a second bending area and a bonding pin area which are connected sequentially in a direction away from the first bending area, and the transition connection area connects the first bending area with the second bending area;

the transition connection area, the second bending area and the bonding pin area are bent to a side of the display region facing away from a display side through the first bending area; and the bonding pin area is bent toward a surface of the display region facing away from the display side through the second bending area, and the bonding pin area is configured to be in bonding connection with an external circuit board, wherein the bonding pin area is closer to the surface of the display region facing away from the display side than the transition connection area, the bonding pin area and the transition connection area overlap in a direction perpendicular to the display region, and both the second bending area and the first bending area are provided to be in an arc surface shape, a protruding direction of an arc surface of the second bending area is opposite to a protruding direction of an arc surface of the first bending area, and a bending radius of the first bending area is larger than a bending radius of the second bending area.

2. The display substrate according to claim 1, wherein a first end of the second bending area is connected to the transition connection area, a second end of the second bending area is connected to the bonding pin area, and the second end of the second bending area is closer to the surface of the display region facing away from the display side than the first end of the second bending area.

3. The display substrate according to claim 1, wherein the transition connection area, the bonding pin area and the display region are disposed in parallel with each other.

4. The display substrate according to claim 1, wherein the first bending area comprises an inorganic composite insulation layer disposed on the base substrate, the inorganic composite insulation layer is provided with a first groove exposing the base substrate, and the first bending area further comprises a first organic layer disposed on the inorganic composite insulation layer and filling the first groove, a first connection line disposed on the first organic layer, a second organic layer disposed on the first organic layer and overlying the first connection line, and a stress protection layer disposed on the second organic layer; the stress protection layer, the second organic layer and the first organic layer of the first bending area are configured such that the first connection line is located in a neutral layer during bending of the first bending area; or/and, the second bending area comprises an inorganic composite insulation layer disposed on the base substrate, wherein the inorganic composite insulation layer is provided with a second groove exposing the base substrate, and the second bending area further comprises a first organic layer disposed on the inorganic composite insulation layer and filling the second groove, a second connection line disposed on the first organic layer, a second organic layer disposed on the first organic layer and overlying the second connection line, and a stress protection layer disposed on the second organic layer; and the stress protection layer, the second organic layer and the first organic layer of the second bending area are configured such that the second connection line is located in a neutral layer during bending of the second bending area.

5. The display substrate according to claim 4, wherein both the first bending area and the second bending area are provided with the stress protection layer, and the stress protection layer of the first bending area and the stress protection layer of the second bending area are connected integrally.

6. The display substrate according to claim 4, wherein the display region comprises a drive structure layer, a light emitting structure layer and an encapsulation structure layer which are stacked on the base substrate, wherein the drive structure layer comprises a pixel drive circuit, and the light emitting structure layer comprises a light emitting element connected to the pixel drive circuit; the drive structure layer comprises a planarization layer, and the light emitting structure layer comprises a pixel definition layer; and the first organic layer and the planarization layer are disposed in a same layer and formed by a same patterning process, and the second organic layer and the pixel definition layer are disposed in a same layer and formed by a same patterning process.

7. The display substrate according to claim 4, wherein a thickness of the stress protection layer is 90 microns to 120 microns.

8. The display substrate according to claim 4, wherein an elastic modulus of the stress protection layer is 200 MPa to 300 MPa.

9. A display apparatus, comprising the display substrate according to claim 1.

10. The display substrate according to claim 2, wherein the first bending area comprises an inorganic composite insulation layer disposed on the base substrate, the inorganic composite insulation layer is provided with a first groove exposing the base substrate, and the first bending area further comprises a first organic layer disposed on the inorganic composite insulation layer and filling the first groove, a first connection line disposed on the first organic layer, a second organic layer disposed on the first organic layer and overlying the first connection line, and a stress protection layer disposed on the second organic layer; the stress protection layer, the second organic layer and the first organic layer of the first bending area are configured such that the first connection line is located in a neutral layer during bending of the first bending area; or/and, the second bending area comprises an inorganic composite insulation layer disposed on the base substrate, wherein the inorganic composite insulation layer is provided with a second groove exposing the base substrate, and the second bending area further comprises a first organic layer disposed on the inorganic composite insulation layer and filling the second groove, a second connection line disposed on the first organic layer, a second organic layer disposed on the first organic layer and overlying the second connection line, and a stress protection layer disposed on the second organic layer; and the stress protection layer, the second organic layer and the first organic layer of the second bending area are configured such that the second connection line is located in a neutral layer during bending of the second bending area.

11. The display substrate according to claim 3, wherein the first bending area comprises an inorganic composite insulation layer disposed on the base substrate, the inorganic composite insulation layer is provided with a first groove exposing the base substrate, and the first bending area further comprises a first organic layer disposed on the inorganic composite insulation layer and filling the first groove, a first connection line disposed on the first organic layer, a second organic layer disposed on the first organic layer and overlying the first connection line, and a stress protection layer disposed on the second organic layer; the stress protection layer, the second organic layer and the first organic layer of the first bending area are configured such that the first connection line is located in a neutral layer during bending of the first bending area; or/and, the second bending area comprises an inorganic composite insulation layer disposed on the base substrate, wherein the inorganic composite insulation layer is provided with a second groove exposing the base substrate, and the second bending area further comprises a first organic layer disposed on the inorganic composite insulation layer and filling the second groove, a second connection line disposed on the first organic layer, a second organic layer disposed on the first organic layer and overlying the second connection line, and a stress protection layer disposed on the second organic layer; and the stress protection layer, the second organic layer and the first organic layer of the second bending area are configured such that the second connection line is located in a neutral layer during bending of the second bending area.

* * * * *